US009612299B2

(12) United States Patent
Wessels et al.

(10) Patent No.: US 9,612,299 B2
(45) Date of Patent: Apr. 4, 2017

(54) GROUP III-V FERROMAGNETIC/NON-MAGNETIC SEMICONDUCTOR HETEROJUNCTIONS AND MAGNETODIODES AND RELATED METHODS OF MONITORING MAGNETORESISTANCE

(71) Applicant: Northwestern University, Evanston, IL (US)

(72) Inventors: Bruce W. Wessels, Wilmette, IL (US); Steven J. May, Chicago, IL (US)

(73) Assignee: Northwestern University, Evanston, IL (US)

( * ) Notice: Subject to any disclaimer, the term of this patent is extended or adjusted under 35 U.S.C. 154(b) by 41 days.

(21) Appl. No.: 14/704,590

(22) Filed: May 5, 2015

(65) Prior Publication Data

US 2016/0018486 A1  Jan. 21, 2016

Related U.S. Application Data

(62) Division of application No. 13/097,688, filed on Apr. 29, 2011, now Pat. No. 9,024,370, which is a division of application No. 11/476,253, filed on Jun. 27, 2006, now Pat. No. 7,956,608.

(60) Provisional application No. 60/694,420, filed on Jun. 27, 2005.

(51) Int. Cl.
| | |
|---|---|
| *G01R 33/12* | (2006.01) |
| *B82Y 25/00* | (2011.01) |
| *G01R 33/09* | (2006.01) |
| *H01L 29/267* | (2006.01) |
| *H01L 43/08* | (2006.01) |
| *H01L 43/10* | (2006.01) |

(52) U.S. Cl.
CPC .......... *G01R 33/1253* (2013.01); *B82Y 25/00* (2013.01); *G01R 33/093* (2013.01); *G01R 33/1284* (2013.01); *H01L 29/267* (2013.01); *H01L 43/08* (2013.01); *H01L 43/10* (2013.01)

(58) Field of Classification Search
CPC .............. G01R 33/1253; G01R 33/093; G01R 33/1284; H01L 43/08; H01L 43/10; H01L 29/267; B82Y 25/00
USPC ....................................................... 324/252
See application file for complete search history.

(56) References Cited

U.S. PATENT DOCUMENTS

| | | | |
|---|---|---|---|
| 3,818,328 | A | 6/1974 | Zinn |
| 4,843,444 | A | 6/1989 | Partin et al. |
| 4,926,226 | A | 5/1990 | Heremans et al. |
| 5,294,287 | A | 3/1994 | Chang et al. |
| 6,469,490 | B1 * | 10/2002 | Glinkowski ........... G01R 33/07 323/294 |
| 6,670,660 | B2 | 12/2003 | Hosotani |

(Continued)

OTHER PUBLICATIONS

H. Baltes and R. Popovic, "Integrated Semiconductor Magnet Field Sensors", IEEE 74, 107 (1986).

(Continued)

*Primary Examiner* — Jay Patidar
(74) *Attorney, Agent, or Firm* — Reinhart Boerner Van Deuren s.c.

(57) ABSTRACT

Ferromagnetic Group III-V semiconductor/non-magnetic Group III-V semiconductor heterojunctions, with a magnetodiode device, to detect heterojunction magnetoresistance responsive to an applied magnetic field.

6 Claims, 7 Drawing Sheets

(56) References Cited

U.S. PATENT DOCUMENTS

Figure 3:
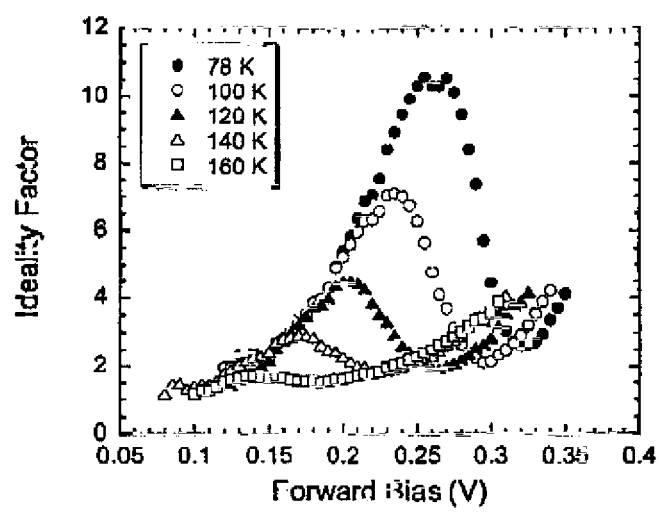

| | | |
|---|---|---|
| 7,405,086 B2 | 7/2008 | LaBella et al. |
| 2001/0022373 A1 | 9/2001 | Minakata et al. |
| 2001/0031547 A1 | 10/2001 | Ohno et al. |
| 2005/0122775 A1 | 6/2005 | Koyanagi et al. |

OTHER PUBLICATIONS

A. Blattner, B. Wessels, "Ferromagnetism in (In, Mn) As alloy thin films grown by metalorganic vapor phase epitaxy", Applied Surface Science, vol. 221, Issues 1-4 (2004), 155-159.

A. Blattner, J. Lensch and B. Wessels, "Growth and Characterization of OMVPE Grown (In,Mn) As Diluted Magnetic Semiconductor", Journal of Electronic Materials, vol. 30, No. 11, 2001, 1408-1411.

G. DeSalvo, R. Kaspi and C. Bozada, "Citirc Acid Etching of GaAs1-xSbx, Al0.5Ga0.5Sb, and InAs for Heterostructure Device Fabrication", J. Electrochem. Soc. vol. 141, No. 12, Dec. 1994, 3526-3531.

N. Lebedeva and P. Kuivalainen, "Modeling of ferromagnetic semiconductor devices for spintronics", Journal of Applied Physics, vol. 93, No. 12, Jun. 15, 2003, 9845-9864.

S. May and B. Wessels, "High-field magnetoresistance in p-(In,Mn)As/ n-InAs Heterojunctions", American Institute of Applied Physics, Letters 88, 2006.

S. May and B. Wessels, "Electronic and megnetotransport properties of ferromagnetic p-(In,Mn)As/ n-InAs heterojunctions", American Vacuum Society, J. Va. Sic. Technol. B. 23(4) Jul./Aug. 2005.

C. Roumenin, "2D magnetodiode sensors based on SOS Technology", Sensors and Actuators A 54 (1996) 584-588.

Y. Soo, S. Kim and Y. Kao, "Local structure around Mn atoms in room-temperature ferromagnetic (In,Mn)As thin films probed by extended x-ray absorption fine structure", American Institute of Physics, vol. 84, No. 4, 2004, 481-483.

I. Zutic, J. Fabian and S. Sarma, "Spin-Polarized Transport in Inhomogeneous Magnetic Semiconductors: Theory of Magnetic/Nonmagnetic p-n Junctions", The American Phyiscal Society, vol. 88, No. 6, Feb. 11, 2002.

Karakushan E I; Stafeev VI. Magnetodiodes. Soviet Physics—Solid State, vol. 3, No. 3, Sep. 1961, pp. 493-498.

\* cited by examiner

FIG. 1
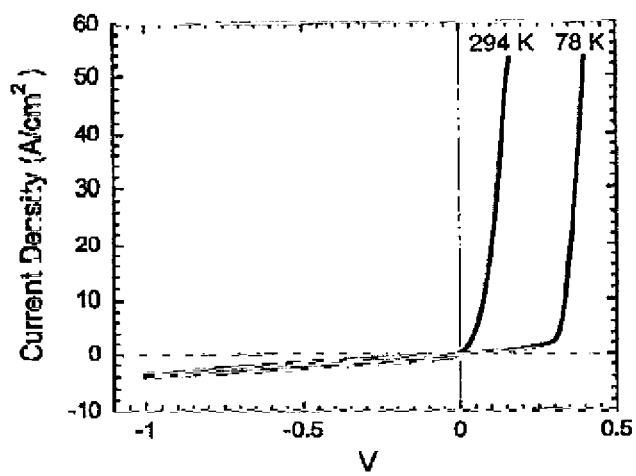
FIG. 2A
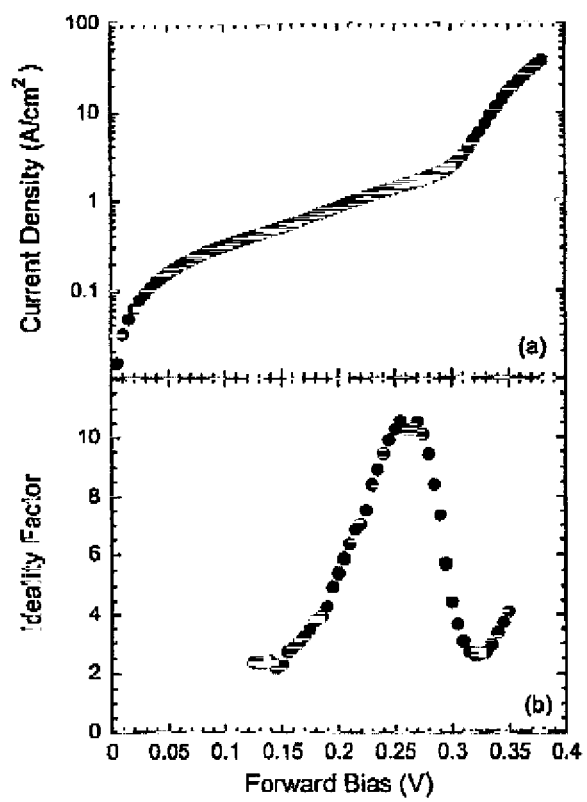
FIG. 2B back contact
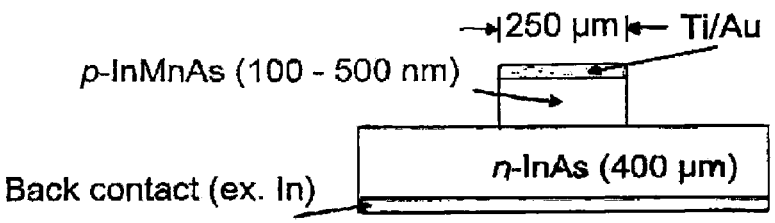
FIG. 6A
front contact
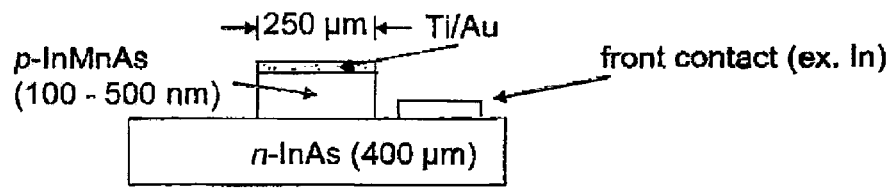
FIG. 6B
FIG. 7
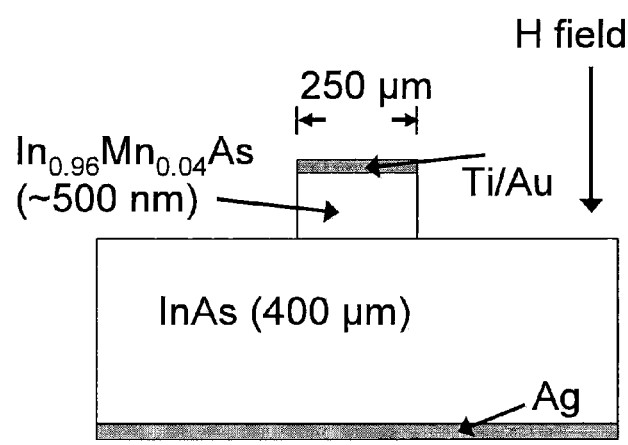

FIG. 9A
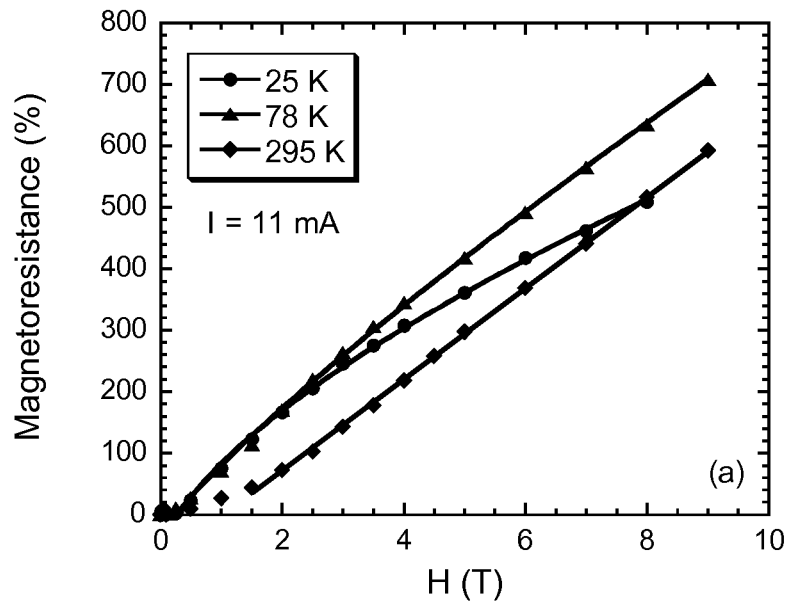
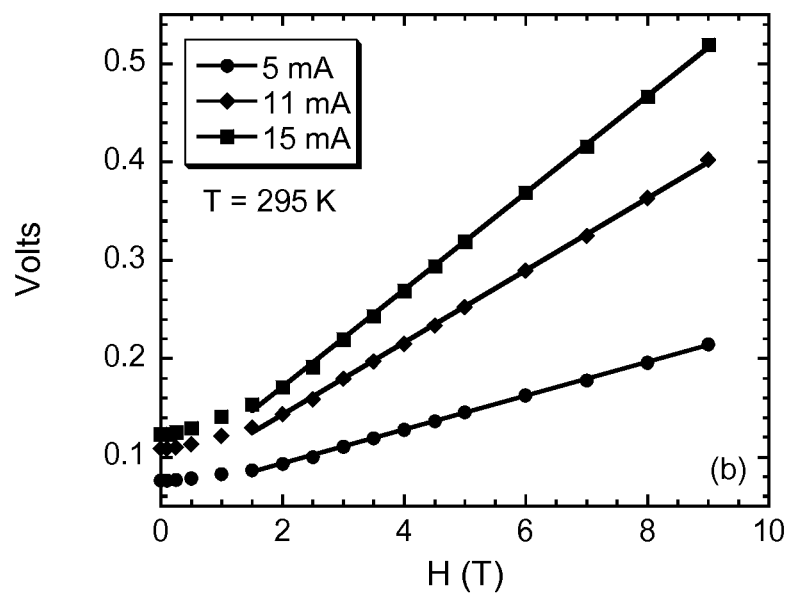
FIG. 9B

GROUP III-V FERROMAGNETIC/NON-MAGNETIC SEMICONDUCTOR HETEROJUNCTIONS AND MAGNETODIODES AND RELATED METHODS OF MONITORING MAGNETORESISTANCE

This application is a divisional of and claims priority to and the benefit of application Ser. No. 13/097,688 filed Apr. 29, 2011 and issued as U.S. Pat. No. 9,024,370 on May 5, 2015, which was a divisional of application Ser. No. 11/476,253 filed Jun. 27, 2006 and issued as U.S. Pat. No. 7,956,608 on Jun. 7, 2011, which claimed priority benefit from application Ser. No. 60/694,420, filed Jun. 27, 2005, each of which is incorporated herein by reference in its entirety.

This invention was made with government support under grant number DMR-0076097 awarded by the National Science Foundation and grant number ECS-0224210 awarded by the National Science Foundation. The government has certain rights in the invention.

BACKGROUND OF THE INVENTION

Magnetic sensors and magnetoresistive devices have been utilized in a wide variety of applications. However, such devices have, for the most part, utilized conventional semiconductors and are restricted in terms of potential use and development due to inherent limitation of such materials. For instance, non-linear response to an applied magnetic field limits the scalability of such devices and places practical limitations on size reduction. Likewise, magnetoresistance in conventional magnetodiodes is dependent upon transverse magnetic fields. Such a limitation has typically required use of at least two such devices for multi-directional sensing.

As a result, the search for an alternate approach has been an on-going concern in the art. Accordingly, the development of ferromagnetic (III-V) semiconductors has generated much interest in the possibility of new magnetoelectronic devices and all-semiconductor spintronic logic devices. Despite the technological potential of such heterojunctions, little is known about their junction current-voltage characteristics. Even less is known about the magnetoresistance of these heterojunctions. Models have been developed for ideal junction characteristics in a magnetic field, but are based on diffusion of carriers over a potential barrier. Such considerations are, at least in part, due to conventional views of such device structures and current III-V semiconductors; that is, tunneling processes are responsible for forward current characteristics, especially at low temperatures and in heavily doped junctions.

SUMMARY OF THE INVENTION

In light of the foregoing, it is an object of the present invention to provide Group III-V ferromagnetic/non-magnetic semiconductor heterojunctions, composites, articles and/or device structures, together with methods for their use, thereby overcoming various deficiencies and shortcomings of the prior art, including those outlined above. It will be understood by those skilled in the art that one or more aspects of this invention can meet certain objectives, while one or more other aspects can meet certain other objectives. Each objective may not apply equally, in all its respects, to every aspect of this invention. As such, the following objects can be viewed in the alternative with respect to any one aspect of this invention.

It can be an object of the present invention to provide a magnetoresistive device providing positive magnetoresistance, notwithstanding strength or direction of applied magnetic field, using p-type and n-type materials of the sort described herein.

It can be another object of the present invention to provide, in conjunction with the preceding objective, a range of ferromagnetic/non-magnetic semiconductor heterojunctions exhibiting linear magnetic response.

It can be another object of the present invention to provide, in conjunction with one or more of the preceding objectives, device structures and/or method(s) for their use, without size limitation and irrespective of applied magnetic field orientation.

Other objects, features, benefits and advantages of the present invention will be apparent from this summary and the following descriptions of certain embodiments, and will be readily apparent to those skilled in the art having knowledge of various magnetoresistant devices, their use and fabrication. Such objects, features, benefits and advantages will be apparent from above as taken into conjunction with the accompanying examples, data, figures and all reasonable inferences to be drawn there from, alone or with consideration of the references incorporated herein.

In part, the present invention can be directed to a junction device comprising a heterojunction composite. Such a device can comprise a composite comprising a p-type Group III-V ferromagnetic semiconductor component comprising a compound of a formula

wherein $M^{III}$ can comprise a Group III metal component, $M^{TM}$ can comprise a magnetic transition metal component, and $M^V$ can comprise a Group V element component. Such a composite can also comprise an n-type Group III-V non-magnetic semiconductor component comprising a compound of a formula $M^{III}M^V$). Without limitation, x can be less than about 0.2; a Group III metal component can be selected from Al, Ga and In; a Group V element component can be selected from P, As and Sb; and a transition metal component can be selected from Cr, Fe and Mn. In certain embodiments, such a device can comprise a ferromagnetic component comprising $(In_{1-x}Mn_x)As$, and a non-magnetic component comprising InAs. Various other Group III-V ferromagnetic semiconductor compounds can be as are described more fully in co-pending application Ser. No. 10/698,352, filed Oct. 31, 2003, the entirety of which is incorporated herein by reference.

As illustrated below, heterojunction composites of this invention can comprise a ferromagnetic component epitaxial with respect to a non-magnetic component. As representative results indicate, such composites can be utilized and/or fabricated with a range of magnetoresistive devices, including but not limited to magnetodiodes. With regard to the latter, composite compositions and/or configurations of this invention can be used to fabricate such a device dimensioned to increase current density and magnetoresistance responsive to an applied magnetic field.

In part, this invention can also be directed to a method of monitoring magnetoresistance. Such a method can comprise providing a device of the sort more broadly described above; applying a voltage across the device; applying a magnetic field oriented with respect to a current through the device; and measuring magnetoresistance of such a current responsive to the applied magnetic field. Alternatively, as would be understood in the art, such a method can be used to measure voltage change upon applying a current. Regardless, in certain embodiments thereof, as can be achieved with various such device structures, magnetoresistance can increase with increasing magnetic field. Demonstrating such a relationship, magnetoresistance can be measured at a temperature from about 25 K to about 300 K. Regardless of temperature, various such embodiments can show magnetoresistance increasing substantially linearly with a magnetic field increasing from about 1.5 T to about 9 T. Such benefits associated with this invention can be especially advantageous at temperatures up to about or higher than 300 K. Likewise, various such embodiments of this invention demonstrate that the magnitude of a linear increase in magnetoresistance can increase with increasing applied current. Such benefits and results can be especially useful at high magnetic field strengths (e.g., up to about 9 T). Regardless, in conjunction with one or more of the device structures described herein, such a monitoring method can be enhanced by decreasing device dimension, to increase current density and increase magnetoresistance.

In part, this invention can also be directed to a magnetodiode device comprising a p-type ferromagnetic semiconductor component comprising a compound of a formula $$(In_{1-x}Mn_x)As$$

wherein x can be greater than zero and less than about 0.02; and an n-type non-magnetic semiconductor component comprising a compound of a formula InAs. As illustrated below, such a device can comprise an epitaxial ferromagnetic film on, coupled to and/or deposited on a non-magnetic substrate. Regardless of ferromagnetic stoichiometry, such a device can be dimensioned to increase current density and magnetoresistance responsive to an applied magnetic field.

This invention can also be directed to a method of using a Group III-V ferromagnetic semiconductor/Group III-V non-magnetic semiconductor heterojunction to detect an applied magnetic field. Such a method can comprise providing a device structure comprising a $(In_{1-x}Mn_x)As/InAs$ heterojunction composite, such a device positioned in an applied magnetic field; applying a voltage across the device; and detecting magnetoresistance of the heterojunction responsive to the applied magnetic field, such magnetoresistance positive under magnetic fields applied both parallel to and perpendicular to current flow through the device. As would be understood by those skilled in the art, such a method can be especially useful with a field applied at about room temperature (e.g., up to about and above 300 K). Regardless, using such a method, heterojunction magnetoresistance can be substantially linearly dependent on such an applied field. Likewise, without limitation as to temperature or field strength, such a method can be employed to detect an applied magnetic field, regardless of angle; that is, whether such a field oriented from about parallel to about perpendicular to current flow through the device. Accordingly, in certain such embodiments of this invention, one such heterojunctive device can detect an applied magnetic field irrespective of its angular orientation to current flow.

BRIEF DESCRIPTIONS OF THE DRAWINGS

FIG. 1. Current density-voltage characteristics for an $In_{0.96}Mn_{0.04}As/InAs$ junction at 78 and 294 K.

FIG. 2A-B. Forward bias J-V characteristics of an In0.96Mn0.04As/InAs junction at 78 K (A). The ideality factor as a function of voltage, calculated after subtracting the linear leakage current from the J-V characteristics, is shown in (B).

FIG. 3. The ideality factor as a function of voltage for an In0.96Mn0.04As/InAs junction at varying temperatures.

Figure 4:
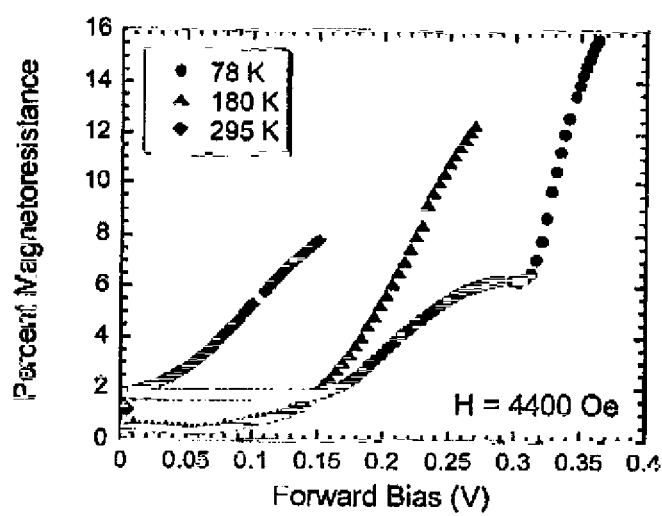

FIG. 4. The longitudinal magnetoresistance (%) as a function of voltage for an In0.96Mn0.04As/InAs junction at 78, 180, and 295 K.

Figures 5A, 5B:
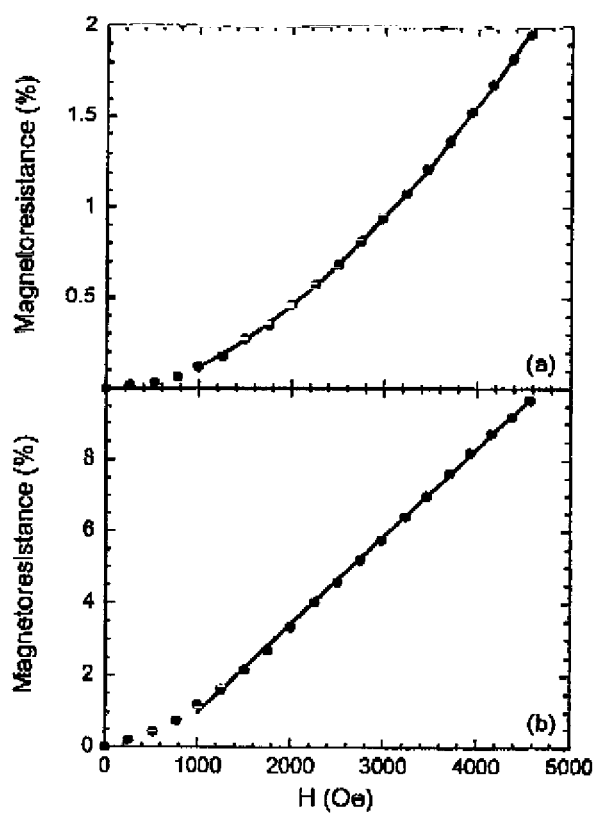

FIG. 5A-B. The magnetic field dependence of the percent magnetoresistance (A) in the low bias, leakage regime and (B) in the high bias (0.335 V), diffusion regime for an In0.96Mn0.04As/InAs junction at 78 K. The solid line in (a) shows the H1.7 dependence, while the solid line in (B) shows the linear magnetic field dependence.

FIG. 6A-B. Schematic diagrams of magnetodiodes, illustrating two types of InAs contact, in accordance with this invention. Component dimensions are illustrative, only.

FIG. 7. Schematic representation of a of the p-In0.96Mn0.04As/n-InAs mesa diode. As above, component dimensions are non-limiting.

Figure 8:
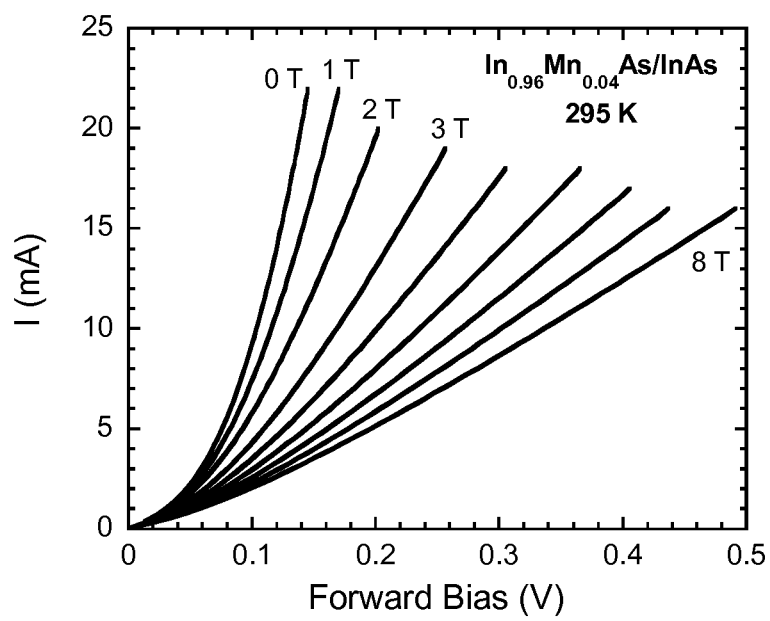

FIG. 8. Forward bias I-V characteristics at 295 K in the presence of magnetic fields ranging from 0-8 T.

FIG. 9 A-B. Percent magnetoresistance as a function of magnetic field at 25, 78, and 295 K (A). Room temperature voltage as a function of magnetic field at I=5, 11, and 15 mA (B).

Figure 10:
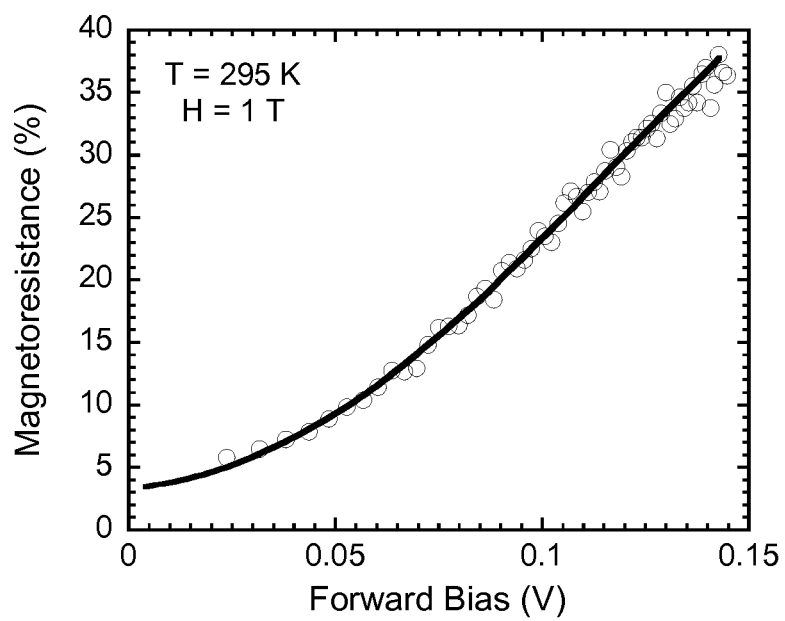

FIG. 10. Magnetoresistance as a function of forward bias at 295 K and 1 T. The solid line shows a fit to the data using eq. (5).

DETAILED DESCRIPTION OF CERTAIN EMBODIMENTS

This invention can be directed to new magnetoresistive devices, related composites and component materials and/or methods relating to the use of a Group III-V ferromagnetic semiconductor and a Group III-V nonmagnetic semiconductor heterojunction. For instance, such magnetodiodes exhibit a large junction magnetoresistance that is linearly dependent on the applied magnetic field at room temperature. As a result, this invention has applications in magnetic field sensors, gaussmeters, and other magnetoresistive devices, and can be readily integrated into current III-V semiconductor circuitry, enabling e.g., magnetic imaging. Accordingly, such devices can, without limitation, be used in a range of applications in which a continuous change in current is desired with increasing magnetic field. This advantage can be utilized, for instance, in conjunction with high field gaussmeters.

Without restriction to any one embodiment, a magnetodiode device of this invention can comprise a ferromagnetic p-type In1-xMnxAs thin film deposited (e.g., by metalorganic vapor phase epitaxy) on an n-type InAs substrate. (See, e.g., FIG. 6.) When such a device is operated in the turn-on region in forward bias, the diode current is strongly dependent on the presence of magnetic fields. Magnetic fields applied either parallel (longitudinal) or perpendicular (transverse) to the flow of current through the devices lead to a positive magnetoresistance. This allows for one device/sensor to measure magnetic fields in all directions, whereas with conventional magnetodiodes at least two sensors would be required for multi-directional sensing. The observed positive magnetoresistance is in contrast to the negative magnetoresistance that was predicted in the art to arise in ferromagnetic/nonmagnetic semiconductor diodes. Magnetoresistance is linearly dependent on the magnetic field for fields greater than 1000 Oe and 2500 Oe, for certain devices operated at 78 K and 295 K, respectively. Such a linear response indicates this invention can be used in conjunction with magnetic field sensors, gaussmeters, and other magnetoresistive devices. Device structures and configurations illustrated herein are provided only for purpose of illustration. Other such structures and component configurations would be understood by those skilled in the art made aware of this invention.

The electronic and magnetotransport properties of epitaxial p-(In,Mn)As/n-InAs heterojunctions were examined in conjunction with this invention. As described below, the junctions were formed by depositing ferromagnetic (In,Mn)As films on InAs (100) substrates using metal-organic vapor phase epitaxy. The current-voltage characteristics of the junctions were measured from 78 to 295 K. At temperatures below 150 K, ohmic currents appear to dominate transport at low bias, followed by defect-assisted tunneling current with increasing bias. At high forward bias, junction transport appears dominated by diffusion current. The magnetoresistance of the junctions were measured as a function of forward bias and applied magnetic field. Without limitation, the magnitude and field dependence of the longitudinal magnetoresistance appear to depend, at least in part, on the junction transport mechanism. Under high bias, a magnetoresistance of 15.7% at 78 K and 8% at 295 K in a 4400 Oe field was measured in an In0.96Mn0.04As/InAs junction. At 78 K, the high bias magnetoresistance increases linearly with magnetic field from 1000 to 4600 Oe.

The current density-voltage characteristics of an In0.96Mn0.04As/InAs junction at 78 and 294 K are shown in FIG. 1. Diode behavior is observed. At temperatures below 220 K, a linear leakage current is observed under reverse bias. This current also dominates the junction characteristics at low forward bias, as will be discussed below.

The forward bias current density-voltage characteristics of the $In_{0.96}Mn_{0.04}As/InAs$ junction measured at 78 K are shown in FIG. 2(a). The total forward bias current density is given by:

$$J = J_{diff} + J_{gr} + J_{tun} + J_{leakage}, \quad (1)$$

where $J_{diff}$ is the diffusion current, $J_{gr}$ is the generation-recombination current, $J_{tun}$ is the tunneling current and $J_{leakage}$ is the leakage current The measured J-V characteristics were fit to the expression, $$J = J_0 \exp\left(\frac{qV}{\eta k_B T}\right), \quad (2)$$

where $\eta$ is the ideality factor defined by the expression, $$\eta = \left(\frac{q}{k_B T}\right)\left(\frac{dV}{d\ln I}\right). \quad (3)$$

At low bias, a linear $J_{leakage}$ component dominates junction transport, indicating the presence of parallel conduction paths shunting the junction. These parallel conduction paths are believed to arise from surface states created during the mesa etching process. After subtracting this ohmic component from the total current, the ideality factor was obtained. Ideality factors are commonly used to determine the origin of diode currents: junction conduction is dominated by diffusion when $\eta=1$, generation and recombination (or diffusion under high injection conditions) when $\eta=2$, and defect-assisted tunneling when $\eta>2$. The ideality factor for the $In_{0.96}Mn_{0.04}As/InAs$ junction as a function of bias is shown in FIG. 2(B). The ideality factor increases from 2.2 to 10.6 as the bias is increased from 0.145 to 0.255 V, respectively. This suggests that the conduction mechanism changes from generation and recombination to defect-assisted tunneling as the bias is increased. Conduction from the diffusion current component begins to increase at biases greater than 0.28 V, leading to a decrease in the ideality factor. The ideality factor reaches a local minimum at 0.32 V of $\eta=2.6$. This ideality factor is greater than the high injection value of $\eta=2$ presumably due to series resistance and continued tunneling currents, both of which can increase the ideality factor. The increase in ideality factor at biases greater than 0.32 V can be attributed to series resistance.

The temperature dependence of the ideality factor for the In0.96Mn0.04As/InAs junction is shown in FIG. 3. The maximum value of the ideality factor decreases with increasing temperature from 10.6 at 78 K to 2.9 at 140 K. The minimum value of the ideality factor arising from diffusion currents also decreases with temperature from 2.6 at 78 K to 1.8 at 140 K. These results indicate that the diffusion current component increases as the temperature increases. Similar transport behavior was also observed in In1-xMnx,As/InAs junctions with x=0.035 and x<0.01. At room temperature, the ideality factors of the all diodes measured ranged from 1.3 to 1.7, indicating that the diffusion and generation-recombination currents dominate junction transport.

The current-voltage characteristics have been measured in the presence of an applied magnetic field. FIG. 4 shows the percent magnetoresistance as a function of voltage for the In0.96Mn0.04As/InAs junction with a 4400 Oe field applied parallel to the direction of current flow. The percent magnetoresistance is given by $100 \times (R(H)-R0)/R0$; a decrease in the junction current corresponds to a positive magnetoresistance. The magnitude of the magnetoresistance is directly dependent on the junction transport mechanism. At 78 K, a constant magnetoresistance of 1.7% is observed under low bias from 0.01 to 0.15 V, where the transport is dominated by ohmic leakage currents. The magnetoresistance begins to increase with the onset of tunneling currents at 0.16 V, reaching 6% at 0.27 V. The magnetoresistance remains at roughly 6% until the bias is increased past 0.31 V, at which point the magnetoresistance increases rapidly with increasing forward bias. The onset of the second increase in magnetoresistance corresponds to the local minimum in ideality factor and accordingly to the diffusive transport regime. The large observed magnetoresistance is equal to 15.7% at 0.4 V. Similar magnetoresistance behavior was also measured in a junction with x<0.01. At 180 K, only two magnetoresistance regimes are present as tunneling currents are not observed. The magnetoresistance is constant from 0.01 to 0.1 V. A rapid increase in magnetoresistance is observed as the bias is increased past 0.1 V, which corresponds to the onset of diffusion current. A magnetoresistance of 8% at 0.15 V is observed at room temperature.

The field dependence of the magnetoresistance is given in FIG. 5, as measured at 78 K in an In0.96Mn0.04As/InAs junction. The magnetoresistance is subquadratic and follows a H1.7 power law dependence in the leakage current regime, as shown in FIG. 5(A). At high biases, where diffusion currents dominate transport, the magnetoresistance is linearly dependent on the applied magnetic field from 1000 to 4600 Oe, as shown in FIG. 5(B). A linear magnetoresistance in the diffusive current regime is also observed at 78 K in the junction with x<0.01, while the low bias magnetoresistance exhibits a H1.8 dependence.

The magnetoresistance observed at low bias, in the ohmic conduction regime, is attributed to Lorentz scattering of carriers throughout the diode. See, R. A. Stradling and P. C. Klipstein, Growth and characterisation of semiconductors (Hilger, Bristol, England; New York, 1990). As the magnetic and electric fields are parallel a negligible magnetoresistance might be expected. However, longitudinal magnetoresistance is often observed in semiconductors due to defects, dislocations or electrical inhomogeneities that scatter carriers. The measured field dependence of $H\gamma$, where $\gamma$ ranges from 1.7 to 1.85, is in relative agreement with the expected H2 dependence of magnetoresistance due to Lorentz scattering. See, S. M. Sze, Physics of semiconductor devices (Wiley, New York, 1981).

The origin of the unusual linear dependence of the magnetoresistance at high bias is currently under study. Nevertheless, the fact that the magnitude and field dependence depends on the specific injection mechanism suggests that the behavior is junction related. The measured magnetoresistance is not attributed to an increased resistance in the bulk InAs substrate or the InMnAs film. The longitudinal magnetoresistance of an InAs substrate and an InMnAs film was measured in the same configuration as the (In,Mn)As/InAs junctions. In both cases, the measured magnetoresistance was less than 1% and independent of applied voltage.

The observed positive magnetoresistance is counter to the magnetoresistance predicted for a ferromagnetic/nonmagnetic semiconductor junction for diffusive transport. A negative magnetoresistance is predicted with the increase in current proportional to $\exp[(\Delta(H)-\Delta(H=0))/k_B T]$, where $\Delta(H)$ is the conduction band-edge splitting due to a magnetic field H. The fact that a positive magnetoresistance is observed suggests that the conduction band splitting in (In,Mn)As is small and that another magnetoresistance mechanism, the origin of which is presently unknown, plays a greater role in magnetotransport.

With reference to examples 3-5, the measured magnetoresistance can be described using the diode equation and adding a series magnetoresistance term R(H) to the argument. The I-V characteristics of the $In_{0.96}Mn_{0.04}As/InAs$ junction are modeled using the equation:

$$I = I_0 \exp\left(\frac{V_A}{\eta k_B T}\right)\left(\frac{-IR_0}{\eta k_B T}\right)\left(\frac{-IR(H)}{\eta k_B T}\right), \quad (4)$$

where $\eta$ is the ideality factor, $R_0$ is the zero-field series resistance, and R(H) is the magnetic field dependent series resistance. From the I-V characteristics, the experimental values of $I_0$, $R_0$, R(H) and $\eta$ were obtained. The ideality factor and R(H=1 T) were fixed at the experimentally obtained values of $\eta=1.41$ and $R=1.14\Omega$, respectively, while $I_0$ and $R_0$ were varied to achieve the best fit. FIG. 10 shows the fit to the magnetoresistance as a function of applied bias at 1 T and 295 K. (See, example 4 and eq. 5). The values of $I_0$ and $R_0$ obtained from the fit, $9\times10^{-4}$ A and $1.37\Omega$ respectively, are in good agreement with the experimentally obtained values of $5.9\times10^{-4}$ A and $1.12\Omega$.

One possible origin of the magnetoresistance is carrier scattering due to fluctuations and clustering of the Mn ions at or near the junction. Parish and Littlewood predicted that mobility disorder can result in a non-saturating linear magnetoresistance in semiconductors. Without restriction to any one theory or mode of operation, an inhomogeneous distribution of magnetic Mn ions could cause fluctuations in the scattering rate of injected electrons, giving rise to such local variations in carrier mobility. While the model of Parish and Littlewood has not been applied to p-n junctions, it should be noted that in $Ag_{2+\delta}Te$ a linear magnetoresistance emerged when the electron and hole concentrations in the material were equivalent. This is consistent with the present results in that the linear magnetoresistance in p-(In,Mn)As/n-InAs junctions occurs only under high injection conditions when the electron and hole concentrations near the depletion region are equivalent. Further, extended x-ray absorption fine structure (EXAFS) measurements have provided evidence that Mn ions cluster into nearest neighbor cation sites forming dimers and trimers in MOVPE grown InMnAs films.

EXAMPLES OF THE INVENTION

Example 1

P-type $In_{1-x}Mn_xAs$ films were deposited at 480° C. by atmospheric pressure metal-organic vapor phase epitaxy on nominally undoped, n-type InAs (100) substrates to form the heterojunctions. Precursors used were trimethylindium (TMIn), 0.3% arsine ($AsH_3$) in hydrogen and tricarbonyl (methylcyclopentadienyl)manganese (TCMn). A pre-growth anneal at 510° C. was carried out under an arsine overpressure in order to remove surface oxide from the InAs substrate. A detailed description of the growth conditions for (In,Mn)As films has previously been reported. See, A. J. Blattner, J. Lensch, and B. W. Wessels, Journal of Electronic Materials 30, 1408 (2001). Manganese concentrations were determined using standards-based energy dispersive x-ray spectroscopy (EDS). X-ray diffraction was used to verify phase purity of the (In,Mn)As films. Film thickness, as determined by profilometry, ranged from about 100-about 525 nm. Room temperature hole concentrations of (In,Mn)As films are on the order of $10^{18}$-$10^{19}$ cm$^{-3}$. The room temperature electron concentration of the InAs substrates was $1.4\times10^{17}$ cm$^{-3}$. Magneto-optical Kerr effect (MOKE) measurements indicated that the $In_{0.96}Mn_{0.04}As$ and $In_{0.965}Mn_{0.035}As$ layers were ferromagnetic at room temperature.

Example 2

Mesa diodes were fabricated from the epitaxial structures using conventional photolithography and a citric acid wet etch. See, G. C. Desalvo, R. Kaspi, and C. A. Bozada, J. Electrochem. Soc. 141, 3526 (1994). The mesa diameter was 250 μm. Ti/Au (15/175 nm) ohmic contacts were evaporated to the (In,Mn)As films. Silver paste was used to make contact to the InAs substrates. The diodes were wire bonded to a non-magnetic chip carrier with gold wire. Low-temperature measurements were carried out in a Janis ST-100 cryostat with a non-magnetic sample holder. A Keithley 2400 source-meter was used to source voltages and measure currents. Magnetoresistance measurements were made in fields of up to 4600 Oe applied parallel to current flow across the junction.

Using a similar approach, high field, longitudinal magnetoresistance measurements were taken on a $p-In_{0.96}Mn_{0.04}As/n-InAs$ junction. A nonsaturating linear magnetoresistance at fields greater than 1.5 T was observed at room temperature. The measured magnetoresistance is well described by a modified diode equation with a magnetic field-dependent series resistance.

Example 3

For these studies, a 500 nm thick $p-In_{0.96}Mn_{0.04}As$ layer was deposited on an undoped n-InAs substrate using atmospheric pressure metal-organic vapor phase epitaxy under conditions previously described. (A. J. Blattner, J. Lensch, and B. W. Wessels, *J. Electron. Mater.* 30, 1408 (2001).) The room temperature electron concentration of the InAs substrate is $2\times10^{16}$ cm$^{-3}$, while the room temperature hole concentration of the p-InMnAs film is on the order of $10^{18}$–$10^{19}$ cm$^{-3}$. The diodes were patterned into 250 μm diameter mesas using photolithography and wet etching. Ti/Au was used as the p-In$_{0.96}$Mn$_{0.04}$As ohmic contact, while Ag was used as the n-InAs ohmic contact. Magnetoresistance measurements were made with the magnetic field applied parallel to the flow of current through the mesa diode using a Quantum Design Physical Properties Measurement System. A schematic of the experimental setup is shown in FIG. 7.

Example 4

FIG. 8 shows the room temperature I-V measurements made with applied magnetic fields over the range of 0 to 8 T. The junction becomes more resistive with increasing magnetic field and shows no sign of saturating with field. The magnetoresistance, MR, defined as $$MR = \left(\frac{dV(H)}{dI} - \frac{dV(H=0)}{dI}\right) / \left(\frac{dV(H=0)}{dI}\right), \quad (5)$$

is shown in FIG. 9A as a function of applied field for a constant current of 11 mA at 25, 78 and 295 K. The room temperature magnetoresistance increases linearly with field from 1.5 to 9 T. The magnitude of the linear magnetoresistance increases with increasing applied current from 360% (5 mA) to 710% (15 mA) in a 9 T field. The field dependence of the magnetoresistance becomes sublinear with decreasing temperatures. At 78 K the magnetoresistance is proportional to $H^{0.84}$, while at 25 K the magnetoresistance is proportional to $H^{0.64}$.

Example 5

Due to its large room temperature magnetoresistance, this device holds promise for magnetic sensing applications. (H. P. Baltes and R. S. Popovic, Proc. IEEE 74, 1107 (1986); R. S. Popovic, *Hall Effect Devices* (Institute of Physics, Bristol; Philadelphia, 2004).) The change in voltage as a function of magnetic field for three operating currents at room temperature is shown in FIG. 9B. For all currents the change in voltage is linear with increasing magnetic field from 1.5 to 9 T.

As shown above and in the accompanying figures, the current-voltage characteristics of p-(In,Mn)As/n-InAs heterojunctions have been measured over the temperature range of 78 to 295 K. Three forward bias transport components are observed in the junctions at temperatures below 150 K. Ohmic leakage currents are observed at low bias, defect-assisted tunneling currents at intermediate bias and diffusion currents dominate at high bias. A positive magnetoresistance is observed with the application of a longitudinal magnetic field. The magnitude and field dependence of the magnetoresistance depend on the junction transport mechanism. A magnetoresistance of 15.7% and 8% is observed under high bias at 78 and 295 K, respectively. At 78 K, the high bias magnetoresistance increases linearly with increasing magnetic field from 1000 to 4600 Oe.

The high field magnetoresistive properties of a p-In$_{0.96}$Mn$_{0.04}$As/n-InAs junction were also measured. Under forward bias, a large, nonsaturating magnetoresistance is observed at temperatures from 25 to 295 K in fields up to 9 T. At room temperature, the magnetoresistance increases linearly with magnetic field from 1.5 to 9 T and is greater than 700% at 9 T. As shown, the magnetoresistance can be simulated using a modified diode equation, including a field-dependent series magnetoresistance.

We claim:

1. A method of monitoring magnetoresistance, said method comprising;
providing a junction device comprising a heterojunction composite comprising a p-type Group III-V ferromagnetic semiconductor component comprising a compound of a formula
$(M^{III}_{1-x}M^{TM}_{x})M^{V}$
and an n-type Group III-V non-magnetic semiconductor component comprising a compound of a formula $(M^{III}M^{V})$, wherein $M^{III}$ comprises a Group III metal component, $M^{TM}$ comprises a magnetic transition metal component and $M^{V}$ comprises a Group V metal component, and x is less than about 0.2; a diode coupled to said ferromagnetic semiconductor component and said non-magnetic semiconductor component of said heterojunction composite; and a voltage source for application of voltage across said device;
applying a voltage across said device;
applying a magnetic field oriented with respect to a current flow through said diode of said device, said magnetic field applied from about parallel to about perpendicular to direction of said current flow; and
measuring magnetoresistance of said current responsive to said applied magnetic field.

2. The method of claim 1 wherein said magnetoresistance increases with increasing magnetic field.

3. The method of claim 2 wherein said magnetoresistance is measured at a temperature from about 25 K to about 300 K.

4. The method of claim 3 wherein said magnetoresistance increases substantially linearly with a magnetic field increasing from about 1.5 T to about 9 T.

5. The method of claim 4 wherein the magnitude of said linear increase in magnetoresistance increases with increasing applied current.

6. The method of claim 1 wherein decreasing said device dimension increases current density and increases magnetoresistance.

* * * * *